(12) United States Patent
Mariner et al.

(10) Patent No.: US 6,404,982 B1
(45) Date of Patent: Jun. 11, 2002

(54) HIGH DENSITY FLASH EVAPORATOR

(75) Inventors: John Thomas Mariner, Avon Lake; Douglas Alan Longworth, Cleveland Hts., both of OH (US)

(73) Assignee: Advanced Ceramics Corporation, Lakewood, OH (US)

(*) Notice: Subject to any disclaimer, the term of this patent is extended or adjusted under 35 U.S.C. 154(b) by 1226 days.

(21) Appl. No.: 08/771,373

(22) Filed: Dec. 16, 1996

Related U.S. Application Data

(63) Continuation of application No. 08/603,498, filed on Feb. 20, 1996, now abandoned, which is a continuation-in-part of application No. 08/314,412, filed on Sep. 28, 1994, now abandoned.

(51) Int. Cl.[7] ......................... C23C 10/00; C23C 16/00; B01D 7/00
(52) U.S. Cl. ..................... 392/389; 392/389; 118/726
(58) Field of Search ................................ 392/388, 389; 118/726, 727

(56) References Cited

U.S. PATENT DOCUMENTS

| | | | | |
|---|---|---|---|---|
| 3,152,006 A | * | 10/1964 | Basche | 422/102 |
| 4,264,803 A | | 4/1981 | Shinko | 392/389 |
| 4,849,146 A | * | 7/1989 | Tanji et al. | 264/81 |
| 4,900,526 A | * | 2/1990 | Matsuda et al. | 423/290 |
| 5,158,750 A | * | 10/1992 | Finicle | 422/102 |
| 5,239,612 A | | 8/1993 | Morris | 392/389 |

* cited by examiner

*Primary Examiner*—Sang Paik
(74) *Attorney, Agent, or Firm*—Anderson Kill & Olic; Eugene Lieberstein; Michael Meller

(57) ABSTRACT

A flash evaporator vaporization vessel for flash evaporating metal under conditions of repeated thermal cycling having a graphite body and an outer layer of pyrolytic boron nitride having a density above 2.15 gm/cc and preferably between 2.19 gm/cc and 2.2 gm/cc.

3 Claims, 1 Drawing Sheet

Single
PBN Coating
Layer

Multiple, Contiguous
PBN Coating
Layers

HIGH DENSITY FLASH EVAPORATOR

This application is a continuation, of application Ser. No. 08/314,412, filed Sep. 28, 1994 Now ABN. This appliction is a continuation, of application Ser. No. 08/603,498, filed Feb. 20, 1996 Now ABN.

FIELD OF INVENTION

This invention relates to a resistance heated flash evaporator for the vaporization of metals and more particularly to a flash evaporator vaporization boat composed of a graphite body and a pyrolytic boron nitride outer coating.

BACKGROUND OF THE INVENTION

Vacuum deposition is a common method for coating metals such as aluminum, copper, zinc, and tin onto various substrates of metal, glass and plastic. The metal is vaporized in a vessel commonly referred to as a "vaporization boat" by electric resistance heating. The boat is connected to a source of electrical power to heat the vessel to a temperature which will cause the metal charge in contact with the boat to vaporize. Typically, the product is placed in an evacuated chamber within which the metal is vaporized. The product may be fed individually or continuously into the chamber or, alternatively, may form part of the chamber itself. A wide variety of product is coated with metal using vapor deposition including ,e.g., television picture tubes, automobile headlights, toys and the like.

The metal charge is placed in a cavity recess machined into the top surface of the boat. Upon reaching the vaporization temperature of the metal the metal charge melts and quickly vaporizes. The charge flashes in a vigorous and abrupt manner and the process is repeated with a new charge of metal. The number of flashes which can be performed in a given time period controls product production. Accordingly, the number of flashes a boat can sustain without failure is a critical performance characteristic of the process. Conversely, when failure occurs the parts being coated are scrapped or have to be redone which involves additional time and cost. To avoid this extra cost the vaporization vessel may be discarded before anticipated failure. A vaporization boat with a short lifetime increases the production cost per part and reduces efficiency.

SUMMARY OF THE INVENTION

A method of resistance heating of metal using a flash evaporator composed of a pyrolytic boron nitride coated graphite body is taught in U.S. Pat. No. 5,239,612 the disclosure of which is herein incorporated by reference. As described in the aforementioned patent the coating of pyrolytic boron nitride (hereinafter "PBN") may be formed by the vapor phase reaction of ammonia and a boron halide such as boron trichloride. The basic chemical vapor deposition process for forming pyrolytic boron nitride is taught in U.S. Pat. No. 3,152,006 and it is well known to those skilled in this art that vapor deposited PBN has a hexagonal crystal structure. It has been discovered in accordance with the present invention that the useful life of the vaporization boat may be extended by increasing the density of the PBN outer coating in contact with the metal to be vaporized to a density above at least 2.19 gm/cc and preferably between 2.19 gm/cc and 2.2 gm/cc.

The flash evaporator vaporization boat of the present invention comprises: a graphite body having a recessed cavity and an outer surface composition of high density pyrolytic boron nitride above a density of at least 2.19 gm/cc.

BRIEF DESCRIPTION OF THE DRAWINGS

Other advantages of the present invention will become apparent from the following detailed description of the invention when read in conjunction with the accompanying drawing as follows.

DETAILED DESCRIPTION OF THE INVENTION

Figure 1:
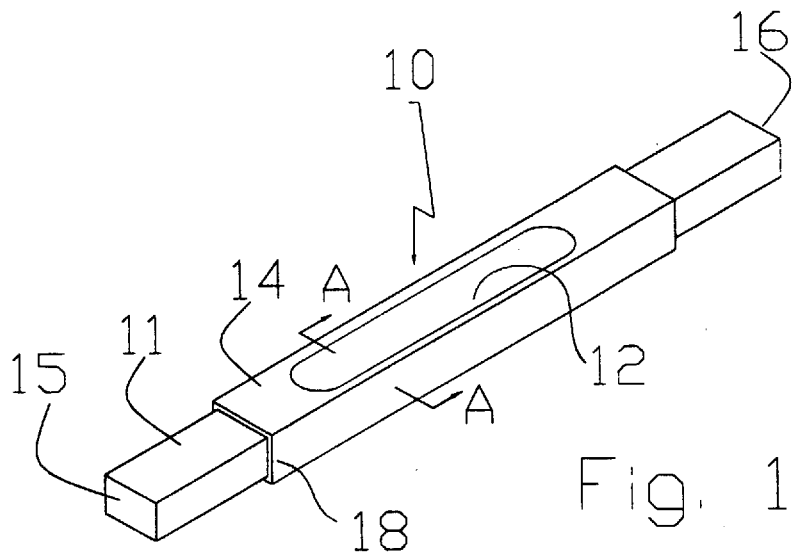
FIG. 1 is an isometric view of the vaporization boat of the present invention.
Figure 2:
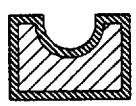
FIG. 2 is a cross-sectional view taken along the lines AA of FIG. 1 showing a single PBN coating layer.
Figure 3:
FIG. 3 is a cross-sectional view taken along the lines AA of FIG. 1 showing an alternate embodiment of the invention with multiple contiguous PBN coating layers. an isometric view of the vaporization boat of the present invention.

A vaporization boat 10 of the resistance type require a precise shape to match the resistance circuit. It is usually made long and narrow as is shown in FIG. 1 with a cavity or depression 12 machined into the body 11 on at least one surface 14. The body 11 is formed from a block of graphite preferably of high density and high strength and is coated with a thin layer of pyrolytic boron nitride 14. The process for coating boron nitride is conventional and briefly involves introducing vapors of ammonia and a gaseous boron halide in a suitable ratio into a heated furnace reactor containing the graphite body with the furnace maintained at a controlled temperature of between 1800° C. to 2200° C. The coating 18 of pyrolytic boron nitride which is usually no thicker than 0.030 inches fully encapsulates the graphite body except for the ends 15 and 16 where the coating is machined off to expose the graphite for making an electrical connection to a clamp assembly for external connection to a source of power.

In accordance with the present invention it has been discovered that the number of flashes that the boat can sustain before failure can be substantially increased thereby improving the performance characteristic of the boat by increasing the density of the surface of the PBN coating in contact with the metal charge to render it less reactive to attack from the aluminum vaporization process. It is hypothesized that a PBN layer having an outer surface of very high density at least equal to 2.19 gm/cc and preferably between 2.19 gm/cc and 2.2 gm/cc. It should be understood that the theoretical maximum density for PBN is essentially 2.27 gm/cc and that the density of a conventional vaporization boat is equal to about 2.15 gm/cc or less with a density of about 1.95 gm/cc being the lower limit for stable operation. Hence the total density range between stable operation and theoretical maximum density is from about 1.95 gm/cc to 2.27 gm/cc.

It is believed that the higher density PBN coating of the present invention forms larger crystallites with smaller interlayer spacing and that this results in a less reactive area per unit volume for attack by molten aluminum. Subsequent testing has substantiated the improved performance using higher density PBN and has demonstrated that the average life of the boat measured by the number of flashes before failure increased by over 20%. Higher density PBN may be achieved by accurately controlling temperature in the furnace reactor within a narrow temperature range of between 1950° C. and 2000° C.

The higher density PBN coating may be formed as a single coating or a duplex coating of more than one layer in which the outer layer has the increased density.

It is also within the purview of the present invention to include an intermediate layer between the PBN layer and the graphite body to adjust the CTE mismatch of the materials. This intermediate layer may represent a layer of pyrolytic graphite of a thickness has a thickness in a range of between 0.0002 and 0.001 inches. The term "pyrolytic graphite" is hereby defined to mean a crystalline carbonaceous structure in which there is a high degree of crystallite orientation. Crystalline orientation is not found in common graphite material. Additionally, pyrolytic graphite exhibits anisotropic physical properties due to its being characterized by oriented slip planes in contrast to isotropic properties of common graphite. Pyrolytic graphite may be formed by chemical vapor decomposition of, for example, methane gas at high temperature in a reactor chamber with a suitable inert diluent.

What we claim is:

1. A flash evaporator vaporization boat comprising: a graphite body having a recessed cavity and an outer surface coating composed of a high density pyrolytic boron nitride having a hexagonal crystal structure and a density above at least 2.19 gm/cc, wherein the coating is deposited by chemical vapor deposition at a temperature of between 1800° C. to 2200° C.

2. A flash evaporator vaporization boat as defined in claim 1 wherein said intermediate layer is composed of pyrolytic graphite.

3. A flash evaporator vaporization boat as defined in claim 2 wherein said intermediate layer has a thickness range of between 0.0002 and 0.001 inches.

* * * * *